United States Patent [19]

Nishimura

[11] Patent Number: 4,523,962
[45] Date of Patent: Jun. 18, 1985

[54] METHOD FOR FABRICATING MONOCRYSTALLINE SEMICONDUCTOR LAYER ON INSULATING LAYER BY LASER CRYSTALLIZATION USING A GRID OF ANTI-REFLECTION COATING DISPOSED ON POLY/AMORPHOUS SEMICONDUCTOR

[75] Inventor: Tadashi Nishimura, Hyogo, Japan

[73] Assignee: Mitsubishi Denki Kabushiki Kaisha, Tokyo, Japan

[21] Appl. No.: 561,104

[22] Filed: Dec. 13, 1983

[30] Foreign Application Priority Data

Dec. 13, 1982 [JP] Japan .................. 57-219961

[51] Int. Cl.³ ............ H01L 21/263; B05D 3/06
[52] U.S. Cl. .................. 148/1.5; 29/576 B; 29/576 T; 148/187; 148/DIG. 91; 357/91; 427/53.1
[58] Field of Search ............. 148/1.5, 187, DIG. 91; 29/576 B, 576 T; 357/91; 427/53.1

[56] References Cited

U.S. PATENT DOCUMENTS

| 4,240,843 | 12/1980 | Celler et al. ............ 148/1.5 |
| 4,319,954 | 3/1982 | White et al. ............ 156/628 |
| 4,323,417 | 4/1982 | Lam .................. 156/613 |
| 4,377,031 | 3/1983 | Goto ................. 29/576 B |
| 4,381,201 | 4/1983 | Sakurai ............... 148/1.5 |
| 4,381,202 | 4/1983 | Mori et al. ............ 148/1.5 |
| 4,414,242 | 11/1983 | Nishimura ............. 427/43.1 |
| 4,415,383 | 11/1983 | Naem et al. ........... 148/187 |
| 4,431,459 | 2/1984 | Teng ................. 148/1.5 |
| 4,437,225 | 3/1984 | Mitzutani ............. 29/576 B |

FOREIGN PATENT DOCUMENTS

| 48926 | 4/1980 | Japan . |
| 126914 | 10/1981 | Japan . |
| 142631 | 11/1981 | Japan . |
| 157019 | 12/1981 | Japan ............. 29/576 T |

OTHER PUBLICATIONS

Biegelsen et al., Appl. Phys. Letts. 38 (Feb. 1981), 150.
Fowler et al., IBM-TDB, 22, (1980) 5473.
Tamura et al., J. Appl. Phys. 50 (1979) 3783.

Primary Examiner—Upendra Roy
Attorney, Agent, or Firm—Sughrue, Mion, Zinn, Macpeak & Seas

[57] ABSTRACT

A method for fabricating a monocrystalline semiconductor layer on an insulating layer in the production of a semiconductor device wherein the location of grain boundaries is accurately controlled, thereby making the crystal orientation of the monocrystalline semiconductor layer uniform over a large area. An antireflection layer is formed above a polycrystalline or amorphous semiconductor layer formed on a main face of a monocrystalline semiconductor substrate which contacts the monocrystalline semiconductor substrate through windows formed in a thick insulating layer. The antireflection layer includes a first portion which covers all of the area of the polycrystalline or amorphous semiconductor layer above the windows, and a second portion, which has the form of a grid composed of parallel lines extending from the first portion in the direction of the crystallographic axis of the monocrystalline semiconductor substrate and partially covering a second area between the first areas. A laser beam is scanned from the first portions of the antireflection layer above the windows in directions parallel to the lines of the grid of the antireflection layer.

3 Claims, 12 Drawing Figures

METHOD FOR FABRICATING MONOCRYSTALLINE SEMICONDUCTOR LAYER ON INSULATING LAYER BY LASER CRYSTALLIZATION USING A GRID OF ANTI-REFLECTION COATING DISPOSED ON POLY/AMORPHOUS SEMICONDUCTOR

BACKGROUND OF THE INVENTION

The present invention relates to a method for forming a semiconductor monocrystalline layer on an insulating layer formed on one of the main planes of a monocrystalline semiconductor substrate. More specifically, the invention relates to such a method in which the semiconductor monocrystalline layer is formed by melting a polycrystalline or amorphous semiconductor layer formed on the insulating layer with a CW laser to thereby monocrystallize the polycrystalline or amorphous semiconductor layer with the monocrystalline semiconductor material forming the substrate as a seed.

FIG. 1 shows an example of the conventional method of forming a monocrystalline semiconductor layer on an insulating layer. In FIG. 1, on a main surface of a monocrystalline silicone substrate 11, specifically, a surface which corresponds to a 100 crystal face thereof, a relatively thick silicon dioxide layer 12 is formed, on which a polycrystalline silicon layer 13 is grown by chemical vapor deposition (DVD). The polycrystalline silicon layer 13 is irradiated with a laser beam 15 to melt it. It is then allowed to solidify, thus monocrystallizing along the main plane of the substrate 11 to thereby form a monocrystalline silicon layer 14.

The polycrystalline silicon layer 13 is formed on the substrate 11 through steps shown in FIGS. 2a to 2d. As shown in FIG. 2a, the silicon substrate 11 having a main surface corresponding to a {100} crystal face of silicon is exposed to an oxidizing atmosphere at 950° C. to form a thermal oxide layer 21 having a thickness of 500 Å on the surface of the substrate. Then a silicon nitride layer 22 about 1000 Å thick is formed thereon by CVD. Thereafter, portions of the silicon nitride layer 22 are removed by photolithography, as shown in FIG. 2b.

Further, by using the silicon nitride layer 22 as a mask, portions of the oxide layer 21 are removed and the silicon substrate 11 is etched to a depth of 5000 Å. Then, the silicon substrate 11 is exposed in an oxidizing atmosphere at 950° C. to form an oxide layer 12 of silicon dioxide having a thickness of about 1 μm on the etched portion of the substrate as shown in FIG. 2c. Then the silicon nitride layer 22 and remaining portions of the oxide layer 21 on the silicon substrate 11 are removed, and thereafter a polycrystalline silicon layer 13 about 7000 Å thick is grown by CVD. Thus, the polycrystalline silicon layer 13 is formed on the thick oxide layer 12 as shown in FIG. 2d, which is in direct contact with the substrate 11 through a region 23, hereinafter referred to as a window 23.

The polycrystalline silicon layer 13 on the window 23 is irradiated with a laser beam 15 as shown in FIG. 1 to melt the polycrystalline silicon layer 13 to a depth sufficient to reach the surface of the substrate. Afterwards, monocrystallization of the polycrystalline silicon layer 13 is achieved through solidification of the melted crystalline silicon layer 13. The laser beam 15 is moved relative to the polycrystalline silicon layer 13 in a direction indicated by an arrow X in FIG. 1 so that a melting and subsequent solidification of the silicon layer progresses in that direction to thereby realize continuous epitaxial growth of the monocrystalline layer, even on the oxide layer 12.

In this conventional method, however, the laser power necessary to melt the portion of the polycrystalline silicon layer 13 on the window 23 is different from that for the portion thereof on the oxide layer 12 because of a difference in thermal conductivity between the substrate and the oxide layer. That is, if the portion of the polycrystalline silicon layer on the oxide layer were irradiated with the same power of laser light necessary to melt the portion on the window, the former portion would be heated excessively, resulting in a tendency for the polycrystalline silicon layer to peel.

In order to resolve this problem, it has been proposed to control the laser power by providing separate antireflection layers on the surfaces of the portions of the polycrystalline silicon layer on the windows and the oxide layers. In this case, however, since the lateral heat distribution inside the polycrystalline silicon layer on the oxide layer is not controlled suitably during melting, the width of the epitaxially grown monocrystalline material at the window portion may not be constant, and no growth of the material may take place on the oxide layer. Also, due to the uncontrolled lateral heat distribution, even a small fluctuation of laser power distribution may cause discontinuities in the epitaxial growth of the monocrystalline material. That is, the power distribution of a laser beam is usually a normal or substantially normal distribution as shown in FIG. 3a, and when the melting and monocrystallization of the polycrystalline silicon layer are performed with such a laser beam, the temperature distribution in the polycrystalline silicon layer will be similar to that shown in FIG. 3a. Therefore, with the movement of the laser beam 31, the solid-liquid interface 32 may be moved as shown in FIG. 3b. That is, the direction 33 along which monocrystallization proceeds changes gradually towards a center line with the movement of the light spot, and thus a crystal grain boundary may form therealong, making uniform monocrystallization impossible.

SUMMARY OF THE INVENTION

This invention was made in view of the abovementioned state of art, and an object thereof is thus to provide a method for fabricating a uniform monocrystalline semiconductor layer from a polycrystalline or amorphous semiconductor layer on a monocrystalline semiconductor substrate which is opened to the polycrystalline or amorphous semiconductor layer through windows formed in a thick insulating layer formed between the substrate and the polycrystalline or amorphous semiconductor layer.

The above object is achieved, according to the present invention, by providing a thin antireflection layer of insulating material on surface portions of the polycrystalline or amorphous semiconductor layer covering the windows and a grid-shaped antireflection layer on the remaining portions of the polycrystalline semiconductor layer. With this arrangement, a larger amount of laser power is absorbed by portions of the polycrystalline or amorphous semiconductor layer on the windows than that absorbed by the remaining portions of the latter layer on the insulating layers, thereby facilitating the epitaxial growth of monocrystalline semiconductor material in the vicinity the windows and controlling the lateral temperature distribution in the polycrystalline or amorphous semiconductor layer on the insulating layer.

BRIEF DESCRIPTION OF THE DRAWINGS

FIG. 4b is a cross-sectional view taken along a line I—I in FIG. 4a;

FIG. 4c is a cross-sectional view taken along a line II—II in FIG. 4a;

DESCRIPTION OF THE PREFERRED EMBODIMENT

Figure 1:
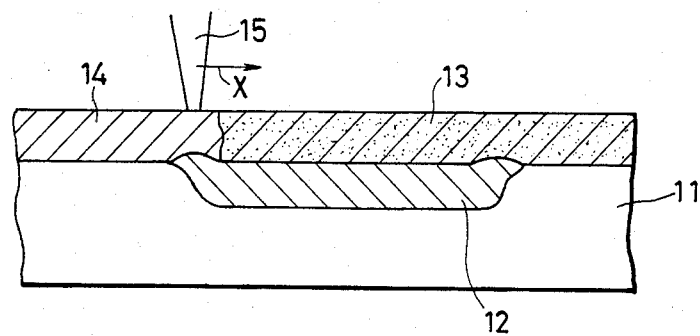
FIG. 1 is the schematic cross-sectional view of a conventional monocrystalline semiconductor layer used for explaining the conventional method of fabricating such a layer.
Figure 2A:
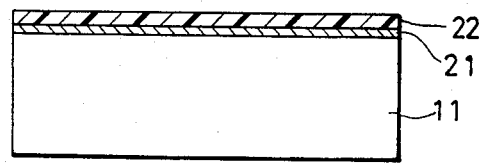
FIGS. 2a to 2d show steps used in the fabrication of the polycrystalline silicon layer in FIG. 1.
Figure 2B:
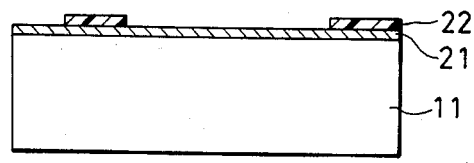
Figure 2C:
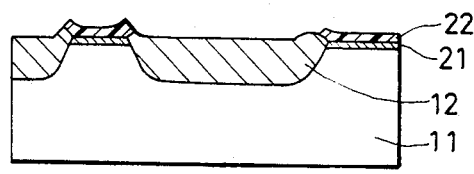
Figure 2D:
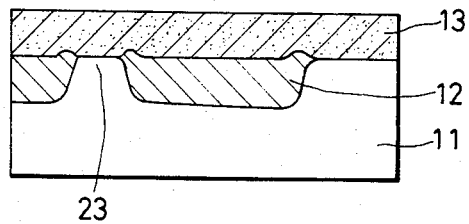
Figure 3A:
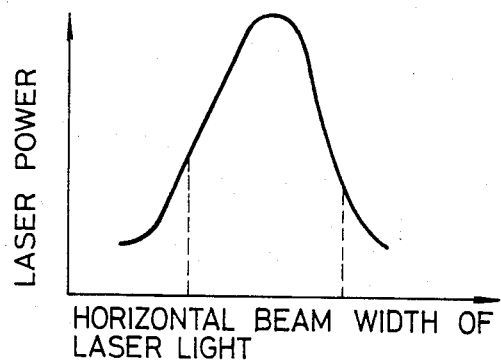
FIG. 3a generally shows the power distribution of a laser beam.
Figure 3B:
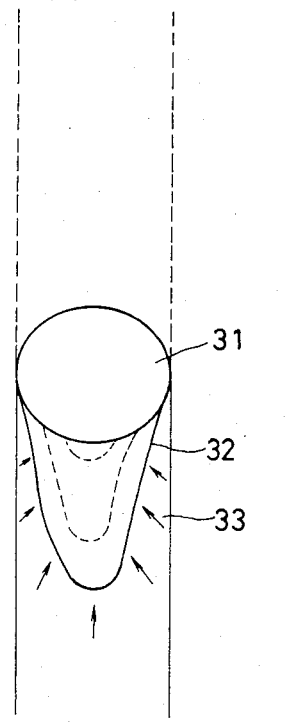
FIG. 3b is a diagram showing a solid-liquid interface and directions of crystal growth when a moving laser beam is directed onto a polycrystalline silicon layer.
Figure 4A:
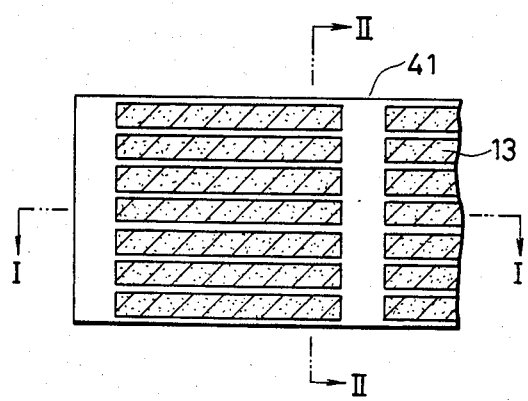
FIG. 4a is a top plan view of a semiconductor device used for explaining a preferred embodiment of the present method of fabricating a monocrystalline semiconductor layer.
Figure 4C:
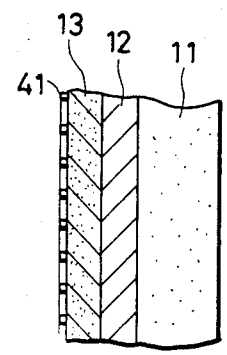
Figure 4B:
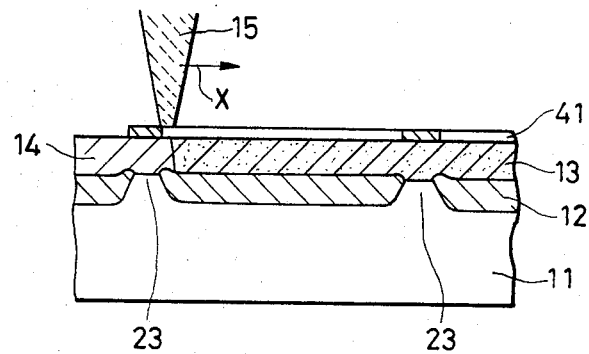

In FIGS. 4a to 4c, in which same or similar portions to those shown in FIGS. 1 and 2 are designated by the same reference numerals as those used in those figures, a polycrystalline silicon layer 13 is formed on a thick silicon oxide layer 12 which is conventionally formed on a monocrystalline silicon substrate 11. The silicon oxide layer 12 has a window 23 through which the polycrystalline silicon layer 13 contacts the silicon substrate 11, in the same manner as in the conventional structure.

On the polycrystalline silicon layer 13, a patterned, thin silicon nitride layer 14 is formed which functions as an antireflection layer. The antireflection layer 41 is preferably formed on the polycrystalline silicon layer 13 by CVD to a thickness on the order of 600 to 1000 Å.

The antireflection layer 41 covers portions of the polycrystalline silicon layer 13 on the window 23 of the oxide layer 12, and partially covers the remaining portions of the layer 13 in a parallel grid pattern as shown in FIG. 4a.

For effecting the formation of a monocrystalline semiconductor layer on the oxide layer 12, a CW laser beam 15 is scanned over the antireflection layer 41 from the portion covering the portion of the polycrystalline silicon layer 13 corresponding to the window 23, parallel to the lines of the grid portion thereof indicated by an arrow X in FIG. 4b.

Figure 5A:
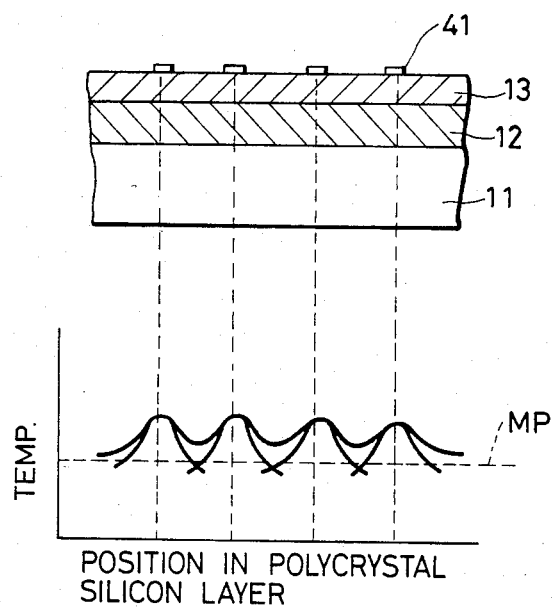
FIG. 5a shows the temperature distribution in a polycrystalline silicon layer which is melted by laser irradiation and the recrystallized.

Epitaxial growth of monocrystalline material starts in the polycrystalline silicon layer 13 from the portion thereof which is in contact with the monocrystalline silicon substrate 11 through the window 23. The monocrystallization of the polycrystalline silicon layer proceeds parallel to the crystallographic axis of the monocrystalline silicon material forming the substrate 11 in the direction of movement of the laser beam 15 towards the area of the polycrystalline silicon layer 13 on the oxide layer 12. Due to the presence of the silicon nitride layer 41 having the grid growth pattern shown in FIG. 5a, the laser irradiation produces a substantially uniform temperature distribution in the polycrystalline silicon layer 13, even though the actual power distribution within the beam is a normal distribution as shown in FIG. 5a. In FIG. 5a, MP indicates the melting point of polycrystalline silicon.

Figure 5B:
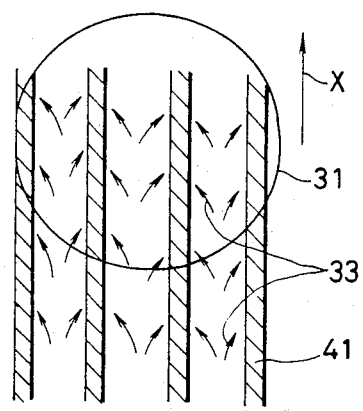
FIG. 5b is a diagram showing directions of crystal growth with movement of a laser beam.

With the laser spot 31 moving in the direction X indicated in FIG. 5b, monocrystallization, which starts in the polycrystalline silicon material on the window 23, always proceeds towards areas of the polycrystalline silicon material of higher temperature, that is towards portions beneath the lines of the grid-like silicon nitride layer 41 as shown by arrows 33 in FIG. 5b. Although crystal grain boundaries may form beneath the lines of the silicon nitride layer 41, it is possible to obtain a substantially high quality monocrystalline silicon layer regardless of the direction in which the laser spot is moved. Further, since, if they exist, the crystal grain boundaries will be along the lines of the grids 41, the location of such boundaries results in no derrogation in performance or device characteristics. Moreover, it is easy to fabricate semiconductor elements outside such grain boundaries, and thus it is possible to produce highly reliable semiconductor devices using the invention.

In the embodiment described above, the antireflection layer is provided by forming the silicon nitride membrane 41 in a thickness of 600–1000 Å directly on the polycrystalline silicon layer by CVD so that portions of the latter layer which are on the insulating layer 13 are partially exposed. The antireflection layer may, however, be formed of other dielectric materials in addition to silicon nitride, provided that the material is transparent to the laser light and functions to prevent substantial reflection of laser light from the polycrystalline silicon layer. For example, a thermal oxide layer prepared by heating the polycrystalline silicon layer or an oxide layer formed thereon by CVD may be used for this purpose. It is further possible to combine either the thermal oxide or the deposited oxide with the silicon nitride layer to obtain a similar effect on the antireflection function. Further, it is possible to cover the whole surface of the wafer with a thin silicon nitride layer to prevent the polycrystalline silicon layer from environmental exposure, with similar effects to those obtained in the described embodiment.

As described in detail, according to the present invention, a thin insulating layer is provided, as an antireflection layer. Further, a polycrystalline or amorphous semiconductor layer is formed on a main face of a monocrystalline semiconductor substrate having, on a portion of a main surface thereof, a thick insulating layer formed with windows through which the polycrystalline or amorphous semiconductor layer contacts the monocrystalline semiconductor substrate. The antireflection layer includes a first portion, which exactly covers all of a first area of the polycrystalline or amorphous semiconductor layer on the windows and a second portion, which has the form of a parallel grid extending from the first portion along the crystallographic axis of the monocrystalline semiconductor substrate and partially covering a second area between adjacent first areas. By scanning a laser beam from the first portions of the antireflection layer above the windows along the second portion of the antireflection layer, epitaxial growth of monocrystalline semiconductor material is easily performed starting from the portion of the polycrystalline semiconductor material in contact with the monocrystalline semiconductor substrate. Further, since the lateral temperature distribution in the polycrystalline or amorphous semiconductor material is controlled with the antireflection layer, monocrystallization takes place uniformly over a relatively large area. In addition, according to the present invention, a high quality monocrystalline semiconductor layer is obtained, the crystallographical axis and location of grain boundaries in which are controlled by the presence of the antireflection layer. Thus, it is possible to produce highly reliable semiconductor devices using the method of the invention.

I claim:

1. In a method for fabricating a monocrystalline semiconductor layer from a polycrystalline or amorphous semiconductor layer formed on a main face of a monocrystalline semiconductor substrate having on said main face a thick insulating layer formed with windows through which said polycrystalline or amorphous semiconductor layer is in contact with said monocrystalline semiconductor substrate, in which the polycrystalline or amorphous semiconductor layer is melted by a scanning thereof with a CW laser beam to monocrystallize said polycrystalline or amorphous semiconductor layer starting from portions of said monocrystalline semiconductor substrate extending through said windows, the monocrystallized semiconductor material having a common crystallographical axis to that of said monocrystalline semiconductor substrate, wherein the improvement comprises the step of: providing a thin antireflection layer of insulating material of silicon nitride on said polycrystalline or amorphous semiconductor layer including a first portion and a second portion, a portion of said polycrystalline or amorphous semiconductor layer above said windows being covered by said first portion of said thin antireflection layer, said second portion of said thin antireflection layer being disposed on remaining portions of said polycrystalline or amorphous semiconductor layer, said second portion having the form of a grid of parallel lines extending from said first portion in a direction of scanning of said laser beam, the power of said laser beam being constant.

2. The method as claimed in claim 1, wherein said monocrystalline semiconductor substrate consists of silicon, said thick insulating layer of silicon dioxide.

3. The method as claimed in claim 2, wherein said antireflecting layer has a thickness in a range of 600 to 1000 Å.

* * * * *